United States Patent
Yoshitomi

(10) Patent No.: US 6,740,974 B2
(45) Date of Patent: May 25, 2004

(54) SEMICONDUCTOR DEVICE HAVING CAPACITORS PROVIDED WITH PROTECTIVE INSULATING FILM

(75) Inventor: Takashi Yoshitomi, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/178,019

(22) Filed: Jun. 24, 2002

(65) Prior Publication Data

US 2002/0197815 A1 Dec. 26, 2002

(30) Foreign Application Priority Data

Jun. 25, 2001 (JP) ........................................ 2001-191716

(51) Int. Cl.[7] .............................................. H01L 23/48
(52) U.S. Cl. ...................... 257/751; 257/758; 438/637; 438/672
(58) Field of Search ................................. 257/751–757, 257/306–311; 438/393–394, 250–251, 782

(56) References Cited

U.S. PATENT DOCUMENTS

2002/0167086 A1 * 11/2002 Stauf et al. .................. 257/751
2002/0185683 A1 * 12/2002 Yamazaki et al. ........... 257/347
2002/0192881 A1 * 12/2002 Ballantine et al. .......... 438/147

* cited by examiner

*Primary Examiner*—Dung A. Le
(74) *Attorney, Agent, or Firm*—Oblon, Spivak, McClelland, Maier & Neustadt, P.C.

(57) ABSTRACT

A semiconductor device includes a first electrode film, first and second electrode films, first and second connection parts, first and second wirings, and a protective insulating film. The second electrode film opposes the first electrode film. The capacitor insulating film is provided between the first electrode film and the second electrode film. The first and second connection parts are electrically connected to the first and second electrode films, respectively. The first wiring is electrically connected to the first electrode film by the first connection part. The second wiring is electrically connected to the second electrode film by the second connection part. The protective insulating film is provided between the capacitor insulating film and the second electrode film or on the second electrode film.

20 Claims, 5 Drawing Sheets

SEMICONDUCTOR DEVICE HAVING CAPACITORS PROVIDED WITH PROTECTIVE INSULATING FILM

CROSS-REFERENCE TO RELATED APPLICATIONS

This application is based upon and claims the benefit of priority from the prior Japanese Patent Application No. 2001-191716, filed Jun. 25, 2001, the entire contents of which are incorporated herein by reference.

BACKGROUND OF THE INVENTION

1. Field of the Invention

The present invention relates to a semiconductor device having MIM (Metal Insulating Metal) capacitors. The invention relates also to a method of manufacturing the semiconductor device.

2. Description of the Related Art

Semiconductor devices having MIM (Metal Insulating Metal) capacitors have been provided in recent years.

FIGS. 14 to 16 are sectional views, explaining a method of manufacturing a conventional semiconductor device that has MIS capacitors. The method will be described with reference to FIGS. 14 to 16.

First, via conductors 113 and first wirings 114, made of copper, for example, are formed in the first inter-layer film 111 and second inter-layer film 112 by damascene process, as is illustrated in FIG. 14. Then, a diffusion-preventing film 115 is formed on the second inter-layer film 112, covering the first wirings 114, by means of sputtering.

Thereafter, an MIM capacitor 120 is formed on the diffusion-preventing film 115. The MIM capacitor 120 comprises a lower electrode film 116, a dielectric film 117, and an upper electrode film 119. The films 116, 117 and 119 are laid one on another, in the order they are mentioned.

As FIG. 15 shows, a third inter-layer film 121 is formed on the diffusion-preventing film 115, thus covering the capacitor 120. The third inter-layer film 121 is processed, acquiring a flat and smooth upper surface. A fourth inter-layer film 122 is formed on the third inter-layer film 121. A fifth inter-layer film 123 is formed on the third inter-layer film 122.

RIE (Reactive Ion Etching) is performed on the third, fourth and fifth inter-layer films 121, 122 and 123, forming via holes 124a, 124b and 124c and wiring trenches 125a, 125b and 225c, as is illustrated in FIG. 16. The resultant structure is subjected to annealing using a hydrogen-containing gas.

As FIG. 16 depicts, via conductors 126a, 126b and 126c made of copper are formed in the via holes 124a, 124b and 124c, respectively. Further, second wirings 127a, 127b and 127c, made of copper, too, are formed in wiring trenches 125a, 125b and 125c, respectively. Then, a diffusion-preventing film 128 made of, for example, SiN (silicon nitride) is formed on the fifth inter-layer film 123, covering the second wirings 127a, 127b and 127c.

In the conventional method, however, annealing using a hydrogen-containing gas is carried out before forming the via conductors 126a, 126b and 126c and the second wirings 127a, 127b and 127c. During the annealing, hydrogen enters the dielectric film 117, inevitably reducing the film 117. Consequently, the permittivity of the film 117 decreases. This results in a decrease in the capacitance of the capacitor 120 and an increase in the leakage current flowing between the electrode films 116 and 119.

BRIEF SUMMARY OF THE INVENTION

According to a first aspect of the present invention, there is provided a semiconductor device that comprises a first electrode film, first and second electrode films, first and second connection parts, first and second wirings, and a protective insulating film. The second electrode film opposes the first electrode film. The capacitor insulating film is provided between the first electrode film and the second electrode film. The first and second connection parts are electrically connected to the first and second electrode films, respectively. The first wiring is electrically connected to the first electrode film by the first connection part. The second wiring is electrically connected to the second electrode film by the second connection part. The protective insulating film is provided between the capacitor insulating film and the second electrode film or on the second electrode film.

According to a second aspect of the present invention, there is provided a method of manufacturing a semiconductor device comprising a capacitor which has a first electrode film, a second electrode film, and a capacitor insulating film provided between the first and second electrode films. The method comprises: forming a protective insulating film between the capacitor insulating film and the second electrode film or on the second electrode film; forming a insulating film on the capacitor; forming a first trench configured to expose a part of the first electrode film, and a second trench configured to expose a part of the second electrode film; performing heat treatment which uses a hydrogen-containing gas; and forming in the first trench a first connection part electrically connected to the first electrode, and forming in the second trench a second connection part electrically connected to the second electrode film.

DETAILED DESCRIPTION OF THE INVENTION

Figure 1:
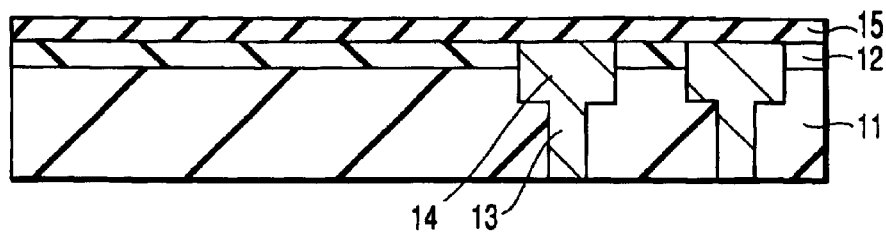
FIGS. 1, 2, 3, 4, 5, 6, 7 are sectional views explaining the sequence of steps of manufacturing a semiconductor device according to the first embodiment of the present invention.

Embodiments of this invention will be described, with reference to the accompanying drawings. In the drawings, the components of any embodiment, which are identical or similar to those of the other embodiments, are designated at the same reference numerals.

[First Embodiment]

The first embodiment is a semiconductor device that comprises a dielectric film forming a capacitor and a protective insulating film provided on the dielectric film and preventing the reduction of the dielectric film.

FIGS. 1 to 7 are sectional views explaining a method of manufacturing the semiconductor device according to the first embodiment. The method will be explained, with reference to FIGS. 1 to 7.

First, a first inter-layer film 11 having low permittivity, such as an FSG (Fluorine Spin valve film Glass) film, is formed as is illustrated in FIG. 1. A second inter-layer film 12 made of, for example, $SiO_2$ (silicon oxide), is formed on the first inter-layer film 11. Then, damascene process is performed, forming via conductors 13 and first wirings 14 made of, for example, Cu (copper) in the first and second inter-layer 11 and 12. A diffusion-preventing film 15 made of, for example, SiN (silicon nitride) is formed on the second inter-layer film 12, covering the first wirings 14. The diffusion-preventing film 15 is, for example, 50 nm thick.

Figure 2:
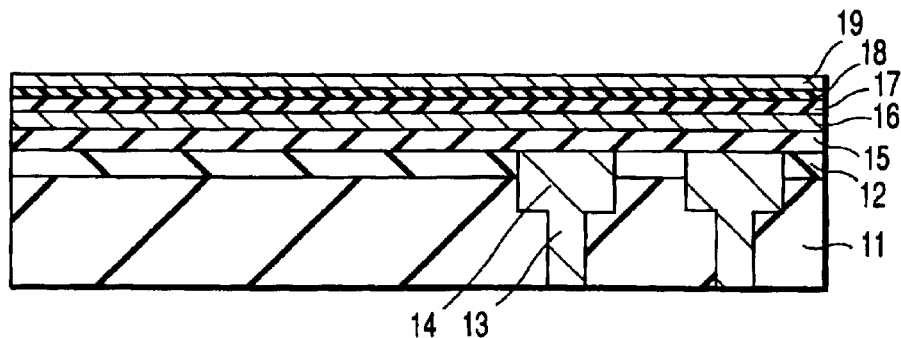

As FIG. 2 shows, a lower electrode film 16 made of, for example, TiN (titanium nitride) is formed on the diffusion-preventing film 15 by means of sputtering. A dielectric film 17 made of, for example, $Ta_2O_5$ (tantalum oxide) is formed on the lower electrode film 16. A protective insulating film 18 made of, for example, $Al_2O_2$ (aluminum oxide) is formed on the dielectric film 17. An upper electrode film 19 made of, for example, TiN, is formed on the protective insulating film 18.

For example, the lower electrode film 16 is 60 nm thick, the dielectric film 17 is 50 nm thick, the insulating protective film 18 is 20 nm thick, and the upper electrode film 19 is 50 nm thick.

Figure 3:
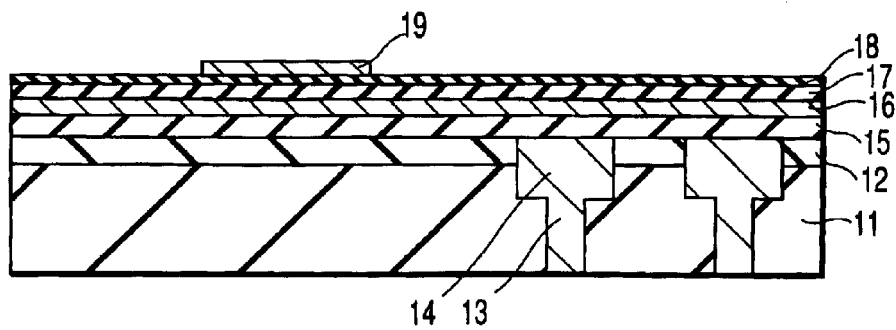

The upper electrode film 19 is coated with a resist (not shown), which is patterned by photolithography. Using the resist as a mask, RIE (Reactive Ion Etching) is effected, thereby patterning the upper electrode film 19 as is illustrated in FIG. 3. Then, the resist is removed from the structure.

Figure 4:
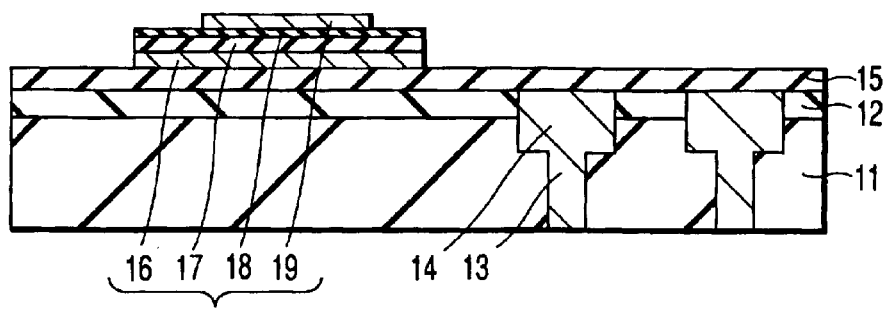

The insulating protective film 18 and the upper electrode film 19 are coated with a resist (not shown). This resist is patterned by means of photolithography. Using the resist as a mask, RIE is performed on the protective insulating film 18, dielectric film 17 and lower electrode film 16, thus patterning these films 18, 17 and 16 as shown in FIG. 4. Thereafter, the resist is removed from the resultant structure.

Thus, there is obtained a MIM (Metal Insulating Metal) capacitor 20 that comprises the lower electrode film 16, dielectric film 17, protective insulating film 18 and upper electrode film 19.

Figure 5:
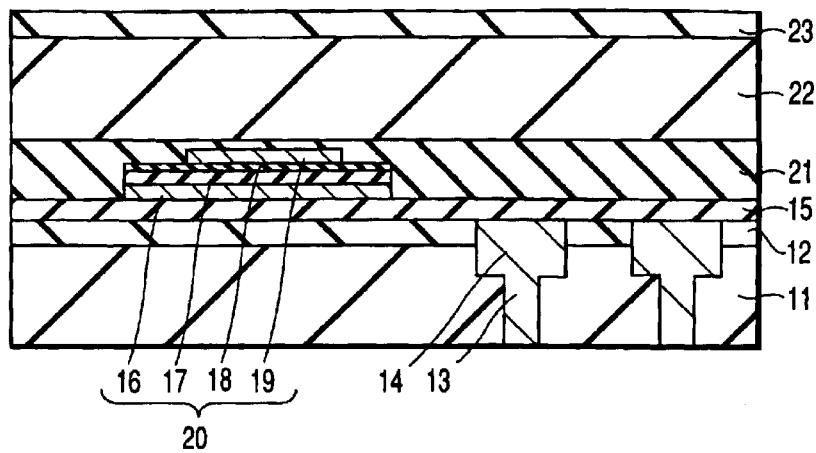

Next, PECVD (Plasma Enhanced Chemical Vapor Deposition) is carried out, thereby forming a third inter-layer film 21 made of, for example, $SiO_2$ on the diffusion-preventing film 15, covering the capacitor 20, as is illustrated in FIG. 5. The third inter-layer film 21 is subjected to CMP (Chemical Mechanical Polishing) is performed and acquires a flat and smooth upper surface.

Next, a fourth inter-layer film 22, such as an FSC film having low permittivity, is formed on the third inter-layer film 21. A fifth inter-layer film 23 made of, for example, $SiO_2$ is formed on the fourth inter-layer film 22.

Figure 6:
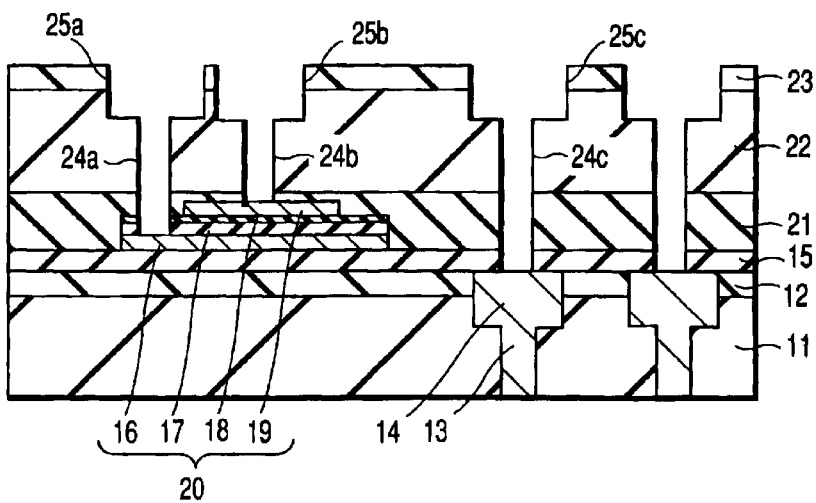

The fifth inter-layer film 23 is coated with a resist (not shown). This resist is patterned by photolithography. Using the resist, thus patterned, as a mask, RIE is performed on the third, fourth and fifth inter-layer films 21, 22 and 23, the protective insulating film 18, the dielectric film 17, and the diffusion-preventing film 15. Via holes 24a, 24b and 24c and wiring trenches 25a, 25b and 25c are thereby made, as is depicted in FIG. 6. Thereafter, the resist is removed from the structure.

The structure is subjected to annealing using a hydrogen-containing gas, for one minute at 300° C. Owing to the annealing, via contacts 26a, 26b and 26c, which will be formed later, can have a sufficiently low resistance.

Figure 7:
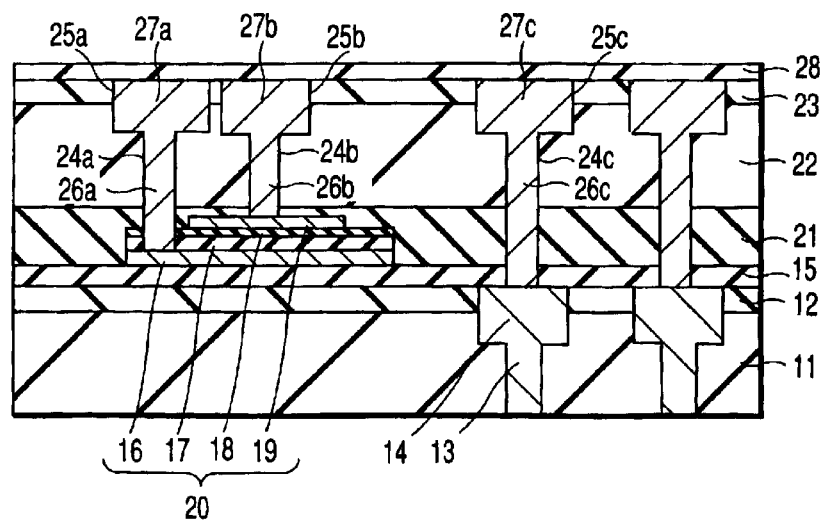

A barrier metal film (not shown), such as a TaN film, is deposited, filling the via holes 24a, 24b and 24c and wiring trenches 25a, 25b and 25c, by means of sputtering. A Cu film (not shown, either) is deposited on the barrier metal film. The Cu film is subjected to CMP and acquires a flat and smooth surface. Thus, as shown in FIG. 7, via conductors 27a, 27b and 27c are formed in the via holes 24a, 24b and 24b and second wirings 27a, 27b and 27c are formed in the wiring trenches 25a, 25b and 25c. Then, a diffusion-preventing film 28 made of, for example, SiN is formed on the fifth inter-layer film 23, covering the second wirings 27a, 27b and 27c.

The via conductors 26a and the second wirings 27a are connected to the lower electrode film 16. The via conductor 26b and the second wiring 27b are connected to the lower electrode film 19. The via conductor 26c and the second wiring 27c are connected to the first wiring 14.

Figure 8:
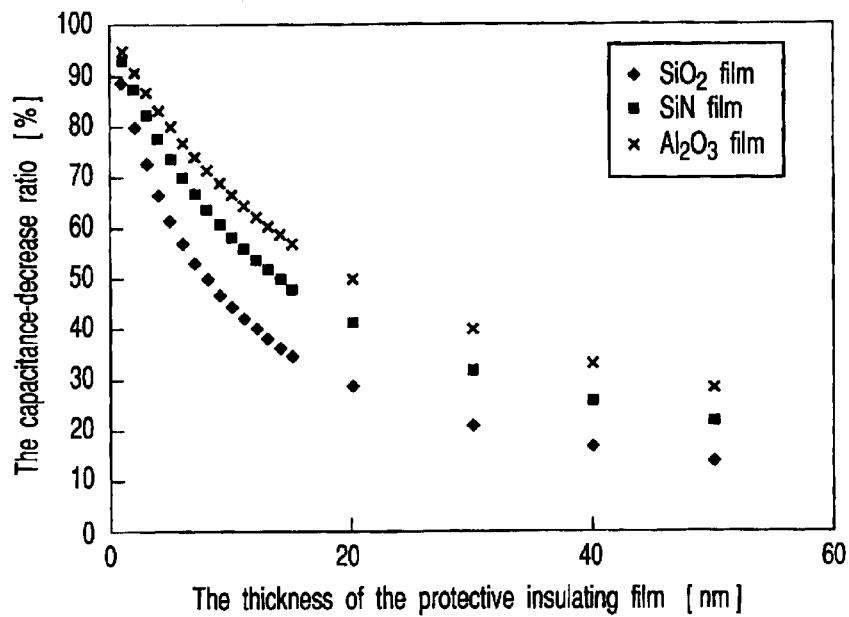
FIG. 8 is a graph representing the relation that the capacitance-decrease ratio of each capacitor and the thickness of the protective insulating film have in the semiconductor device.

FIG. 8 is a graph representing the relation that the capacitance-decrease ratio of each capacitor has with respect to the thickness of the protective insulating film. The term "capacitance-decrease ratio" means the ratio of the capacitance C2 of the capacitor 120 comprising the protective insulating film 18 on provided the dielectric film 17 to the capacitance C1 of the conventional capacitor 20 having no protective insulating film provided on the dielectric film 117. The lower the ratio, the smaller the capacitance C2 is than the capacitance C1.

The protective insulating film 18 may be an $SiO_2$ film having relative dielectric constant of 4, an SiN film having relative dielectric constant of 7, or an $Al_2O_2$ film having relative dielectric constant of 10. The dielectric film 17, or $Ta_2O_5$ film, has permittivity of 25.

As FIG. 8 reveals, the higher and smaller are the relative dielectric constant and thickness of the protective insulating film 18, the lower the capacitance-decrease ratio.

Assume that the protective insulating film 18 is made of $Al_2O_2$. Then, it is desired that the film 18 should have a thickness X of: $10\ nm \leq X \leq 20$ nm, for three reason. First, it is difficult to form protective insulating films that are thinner than 10 nm. Second, if the film 18 is thinner than 10 nm, its ability of preventing the reduction of the dielectric film 17 will decrease. Third, if the film 18 is thicker than 20 nm, the capacitance-decrease ratio of the capacitor 20 falls to 50% or more and the capacitor 20 will fail to function reliably.

In other words, it is desired that the protective insulating film 18 should have a thickness X that ranges from 10% to 40% of the thickness of the dielectric film 17.

The higher the permittivity of the film 18 is, the lower is the capacitance-decrease ratio of the capacitor 20. Hence, to suppress the capacitance-decrease ratio, it is preferred that the protective insulating film 18 should have permittivity $\epsilon$ of 10 or more like $Al_2O_2$ films. Most preferably, $10 \leq \epsilon \leq 30$.

In the first embodiment, the protective insulating film 18 is provided on the dielectric film 17 of the capacitor 20. Namely, the protective insulating film 18 covers the dielectric film 17. The protective insulating film 18 can therefore prevent hydrogen from entering the dielectric film 17 even if the structure is annealed by using a hydrogen-containing gas. The film 18 can prevent the reduction of the dielectric film 17 and, ultimately, a decrease in the permittivity of the dielectric film 17. This not only suppresses the decrease in the capacitance of the capacitor 20, but also prevents an increase in the leakage current flowing between the electrode film 16 and 19.

As indicated above, the protective insulating film 18, which is provided on the dielectric film 17, has high relative dielectric constant and is relatively thin. This also helps to suppress the decrease in the capacitance of the capacitor 20.

The protective insulating film 18 can be patterned at the same time the dielectric film 17 and the lower electric electrode 16 are patterned. Therefore, the number of the process steps required is relatively small.

As FIG. 7 shows, the diffusion-preventing film 15 is provided beneath the capacitor 20. The element (not shown) provided below the capacitor 20 is not contaminated with copper (Cu), i.e., the material of the second wirings 27a, 27b and 27c and via conductors 26a, 26b and 26c.

The dielectric film 17 is not limited to a $Ta_2O_5$ film. It may be a TaO film (tantalum oxide film). The via conductors 13, 26a, 26b and 26c may be made of tungsten (W).

The via conductors via conductors 13, 26a, 26b and 26c and the second wirings 14, 27a, 27b and 27c may be formed by any methods other than the one described above. For instance, they may be formed in the following sequence of steps. At first, via holes 24a, 24b and 24c are first made. Then, the via holes 24a, 24b and 24c are filled with Cu or the like, thereby forming the via conductors 26a, 26b and 26c. Next, wiring trenches 25a, 25b and 25c are made. Finally, these trenches 25a, 25b and 25c are filled with Cu or the like, thus forming the second wirings 27a, 27b and 27c.

[Second Embodiment]

A semiconductor device according to the present invention will be described. In the second embodiment, a protective insulating film is provided on the upper electrode film of the capacitor, preventing the reduction of the dielectric film of the capacitor. The second embodiment will be described, with regard to only the features that differ from those of the first embodiment.

FIGS. 9 to 13 are sectional views explaining a method of manufacturing the semiconductor device according to the second embodiment. A method of manufacturing this semiconductor device will be explained.

Figure 9:
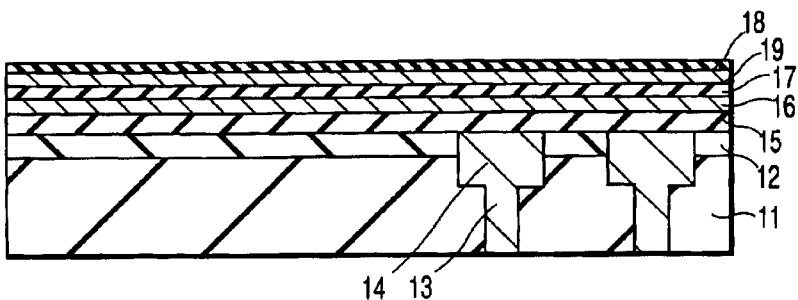
FIGS. 9, 10, 11, 12, 13 are sectional views explaining a method of manufacturing a semiconductor device according to the second embodiment of the invention.

As FIG. 9 shows, via conductors 13 and first wirings 14, all made of Cu, are formed in first and second inter-layer films 11 and 12 in the same way as in the first embodiment. A diffusion-preventing film 15 made of, for example, SiN is formed by sputtering on the second inter-layer film 12, covering the first wirings 14.

Then, a lower electrode film 16 made of, for example, TiN is formed on the diffusion-preventing film 15 by means of sputtering. A dielectric film 17 made of, for example, $Ta_2O_5$ is formed on the lower electrode film 16. An upper electrode film 19 made of, for example, TiN, is formed on the dielectric film 17. A protective insulating film 18 made of, for example, $Al_2O_2$ is formed on the upper electrode film 19. The protective insulating film 18 is similar to its counterpart of the first embodiment and will not be described in detail.

Figure 10:
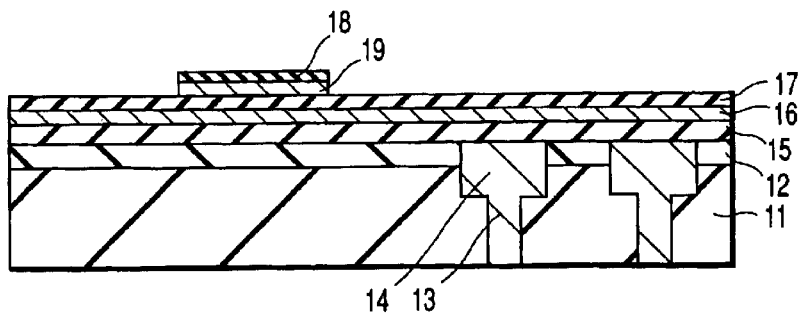

As FIG. 10 shows, the protective insulating film 18 is coated with a resist (not shown), which is patterned by photolithography. Using the resist as a mask, RIE (Reactive Ion Etching) is effected, thereby patterning the protective insulating film 18 and the upper electrode film 19. Then, the resist is removed from the structure.

Figure 11:
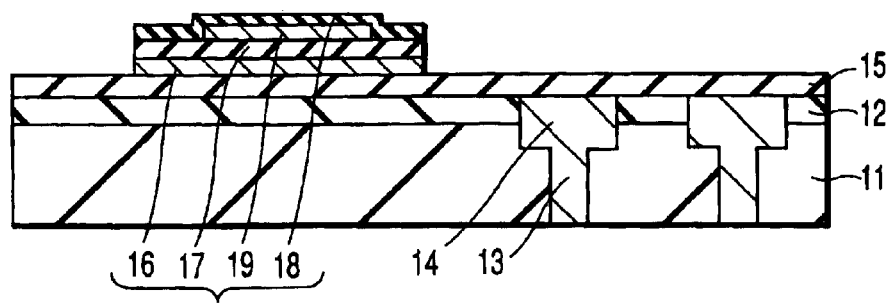

The insulating protective film 18 and the dielectric film 17 are coated with a resist (not shown). This resist is patterned by means of photolithography. Using the resist as a mask, RIE is performed on the dielectric film 17 and lower electrode film 16, thus patterning these films 18, 17 and 16, as is illustrated in FIG. 11. Thereafter, the resist is removed from the resultant structure.

Thus, there is obtained a MIM (Metal Insulating Metal) capacitor 20 that comprises the lower electrode film 16, dielectric film 17, upper electrode film 19 and protective insulating film 18.

Figure 12:
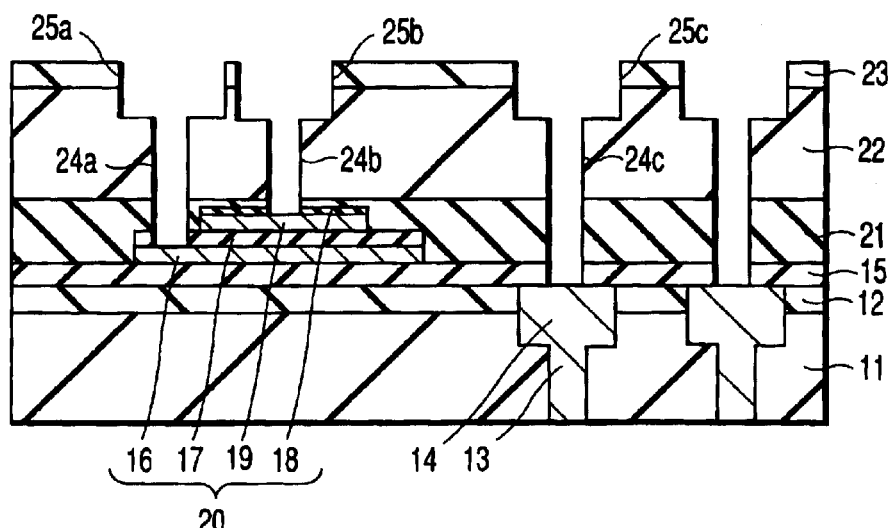

As FIG. 12 shows, a third inter-layer film 21, a fourth inter-layer film 22, and a fifth inter-layer film 23 are formed in the same way as in the first embodiment. Further, via holes 24a, 24b and 24c and second wirings 27a, 27b and 27c are formed. The structure is subjected to annealing using a hydrogen-containing gas, for one minute at 300° C.

Figure 13:
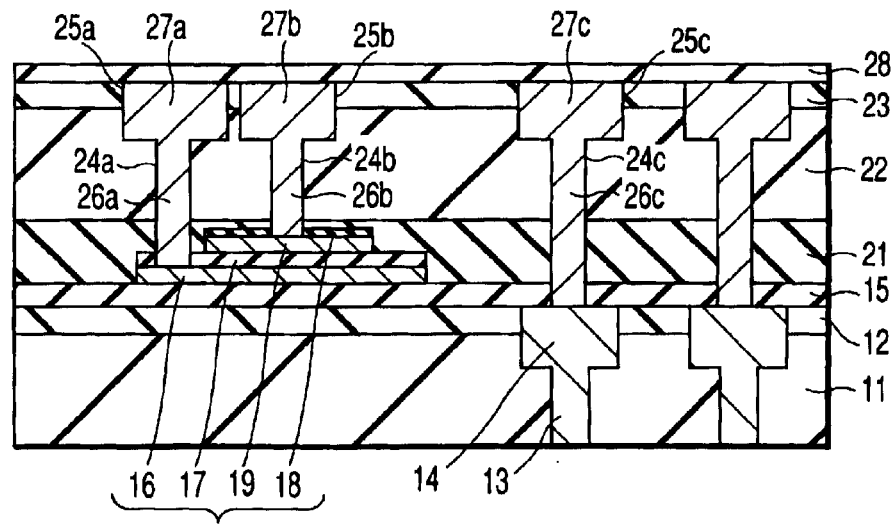
Figure 14:
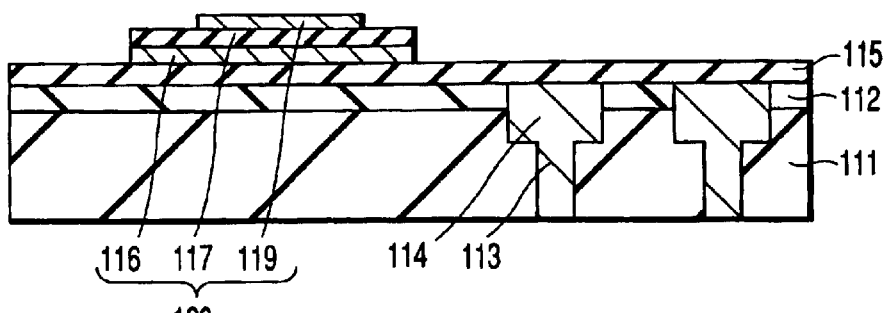
FIGS. 14, 15, 16 are sectional views for explaining a conventional method of manufacturing a semiconductor device.
Figure 15:
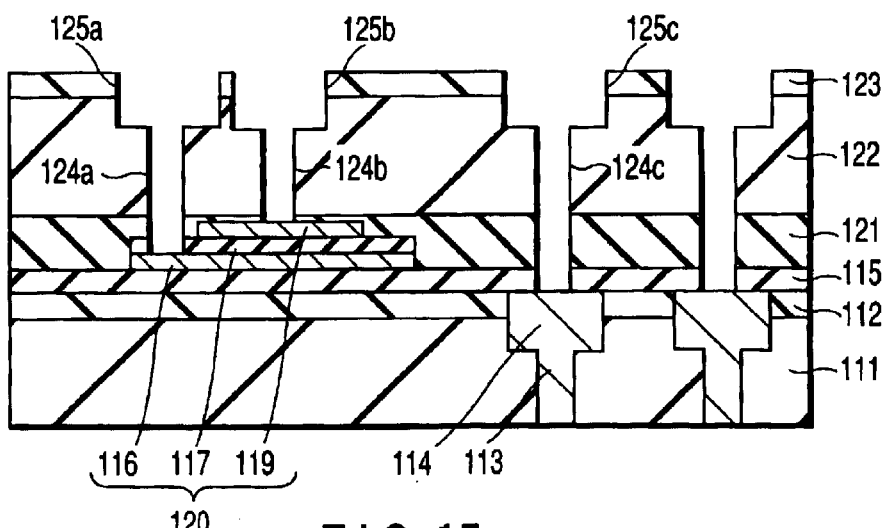
Figure 16:
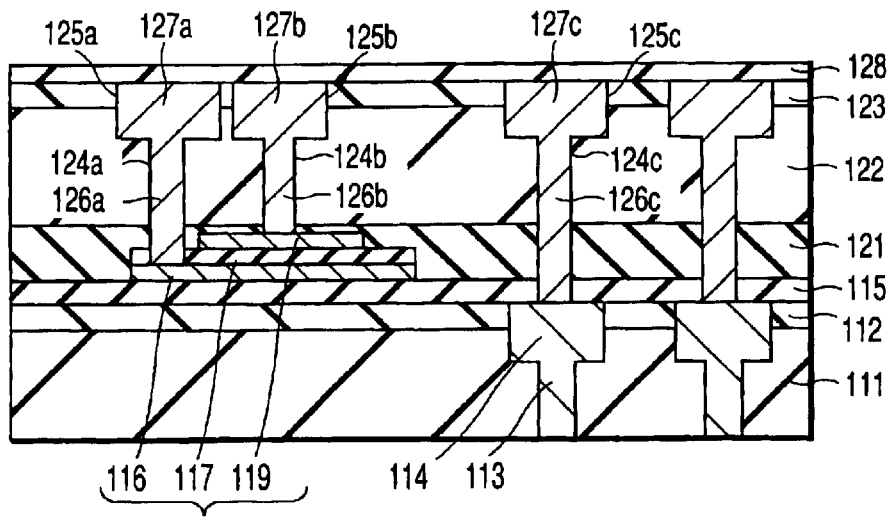

Next, via conductors 26a, 26b and 26c and second wirings 27a, 27b and 27c are formed as is illustrated in FIG. 13. The via conductors 26a, 26b and 26c are connected to the lower electrode film 16, upper electrode film 19 and first wiring, respectively. The second wirings 27a, 27b and 27c are connected to the lower electrode film 16, upper electrode film 19 and first wiring, respectively. Thereafter, a diffusion-preventing film 28 made of, for example, SiN is formed on the fifth inter-layer film 23, covering the second wirings 27a, 27b and 27c.

In the second embodiment, the protective insulating film 18 that can prevent the reduction of the dielectric film 17 is provided on the upper electrode film 19 of the capacitor 20. The protective insulating film 18 can prevent hydrogen from entering the dielectric film 17 even if the structure is annealed by using a hydrogen-containing gas. The film 18 can therefore prevent the reduction of the dielectric film 17 and, ultimately, a decrease in the permittivity of the dielectric film 17. This not only suppresses the decrease in the capacitance of the capacitor 20, but also prevents an increase in the leakage current flowing between the electrode films 16 and 19.

The protective insulating film 18 can be patterned at the same time the upper electrode film 19 is patterned. Therefore, the number of the process steps required is relatively small.

In the second embodiment, the protective insulating film 18 is provided on the upper electrode film 19. Nevertheless, the protective insulating film 18 may not be provided at all. If this is the case, the upper electrode film 19 may be a film that can prevent the reduction of the dielectric film 17. Preferably, the upper electrode film 19 is, for example, an aluminum (Al) film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first electrode film formed of titanium nitride;
   a second electrode film formed of titanium nitride, located above the first electrode film and disposed opposing the first electrode film;
   a capacitor insulating film provided between the first electrode film and the second electrode film;
   a first connection part electrically connected to the first electrode film;
   a second connection part electrically connected to the second electrode film;
   a first wiring electrically connected to the first electrode film by the first connection part;
   a second wiring electrically connected to the second electrode film by the second connection part; and
   a protective insulating film configured to prevent a chemical reduction of the capacitor insulating film, and which is provided only at a position between the capacitor insulating film and the second electrode film.

2. A semiconductor device according to claim 1, wherein the protective insulating film has relative dielectric constant $\epsilon$ of at least 10.

3. A semiconductor device according to claim 1, wherein $10 \leq \epsilon \leq 30$, where $\epsilon$ is relative dielectric constant of the protective insulating film.

4. A semiconductor device according to claim 1, wherein $10 \text{ nm} \leq X \leq 20 \text{ nm}$, where X is a thickness of the protective insulating film.

5. A semiconductor device according to claim 1, wherein the protective insulating film has a thickness X that ranges from 10% to 40% of the thickness of the capacitor insulating film.

6. A semiconductor device according to claim 1, wherein the capacitor insulating film is a tantalum oxide film.

7. A semiconductor device according to claim 1, wherein the protective insulating film is an aluminum oxide film.

8. A semiconductor device according to claim 1, further comprising a diffusion-preventing film provided below the first electrode film.

9. A semiconductor device according to claim 1, wherein the first wiring and the second wiring are formed of copper.

10. A semiconductor device according to claim 1, wherein the first connection part and the second connection part are formed of copper or tungsten.

11. A semiconductor device comprising:

a first electrode film formed of titanium nitride;

a second electrode film formed of titanium nitride, and located above the first electrode film and disposed opposing the first electrode film;

a capacitor insulating film provided between the first electrode film and the second electrode film;

a first connection part electrically connected to the first electrode film;

a second connection part electrically connected to the second electrode film;

a first wiring electrically connected to the first electrode film by the first connection part;

a second wiring electrically connected to the second electrode film by the second connection part; and a protective insulating film which is provided only on a side of the second electrode film opposite to the capacitor insulating film, and which is configured to prevent a chemical reduction of the capacitor insulating film.

12. A semiconductor device according to claim 11, wherein the protective insulating film has a relative dielectric constant $\epsilon$ of at least 10.

13. A semiconductor device according to claim 11, wherein $1 \leq \epsilon \leq 30$, where $\epsilon$ is a relative dielectric constant of the protective insulating film.

14. A semiconductor device according to claim 11, wherein $10 \text{ nm} \leq X \leq 20 \text{ nm}$, where X is a thickness of the protective insulating film.

15. A semiconductor device according to claim 11, wherein the protective insulating film has a thickness X that ranges from 10% to 40% of a thickness of the capacitor insulating film.

16. A semiconductor device according to claim 11, wherein the capacitor insulating film is a tantalum oxide film.

17. A semiconductor device according to claim 11, wherein the protective insulating film is an aluminum oxide film.

18. A semiconductor device according to claim 11, further comprising a diffusion-preventing film provided below the first electrode film.

19. A semiconductor device according to claim 11, wherein the first wiring and the second wiring are formed of copper.

20. A semiconductor device according to claim 11, wherein the first connection part and the second connection part are formed of copper or tungsten.

* * * * *